United States Patent
Koenen et al.

(10) Patent No.: US 8,922,756 B2
(45) Date of Patent: Dec. 30, 2014

(54) POSITION MEASUREMENT SYSTEM, LITHOGRAPHIC APPARATUS AND DEVICE MANUFACTURING METHOD

(75) Inventors: Willem Herman Gertruda Anna Koenen, Roermond (NL); Emiel Jozef Melanie Eussen, Eindhoven (NL); Engelbertus Antonius Fransiscus Van Der Pasch, Oirschot (NL); Robbert Edgar Van Leeuwen, Eindhoven (NL); Adrianus Hendrik Koevoets, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 324 days.

(21) Appl. No.: 13/589,775

(22) Filed: Aug. 20, 2012

(65) Prior Publication Data

US 2013/0050670 A1 Feb. 28, 2013

Related U.S. Application Data

(60) Provisional application No. 61/527,413, filed on Aug. 25, 2011, provisional application No. 61/592,390, filed on Jan. 30, 2012.

(51) Int. Cl.
| | |
|---|---|
| *H01L 23/544* | (2006.01) |
| *G03F 9/00* | (2006.01) |
| G03F 7/20 | (2006.01) |
| H01L 21/68 | (2006.01) |

(52) U.S. Cl.
CPC .............. *H01L 23/544* (2013.01); *G03F 7/70* (2013.01); *H01L 21/682* (2013.01); *G03F 9/7019* (2013.01); *H01L 2223/5442* (2013.01); *H01L 2223/54426* (2013.01); *H01L 2223/54453* (2013.01); *H01L 2223/5446* (2013.01); *G03F 7/70775* (2013.01)
USPC .... 355/72; 310/12.05; 310/12.06; 310/12.19; 355/75; 355/77; 356/399; 356/400; 356/401; 356/500; 356/509

(58) Field of Classification Search
CPC . G01D 5/34746; G03F 7/705; G03F 7/70633; G03F 7/70725; G03F 7/70775; G03F 9/70; G03F 9/7019; G03F 9/7092; H01L 21/68–21/682; H01L 23/5442; H01L 223/5442; H01L 2223/54426; H01L 223/54453; H01L 2223/5446
USPC ............. 310/12.05, 12.06, 12.19; 355/52, 55, 355/68, 72, 75, 77; 356/399–401, 500, 508, 356/509
See application file for complete search history.

(56) References Cited

U.S. PATENT DOCUMENTS

| | | | |
|---|---|---|---|
| 8,451,454 B2 | 5/2013 | Koenen et al. | |
| 2009/0128791 A1 | 5/2009 | Koenen et al. | |
| 2011/0205510 A1* | 8/2011 | Menchtchikov et al. | ........ 355/53 |

FOREIGN PATENT DOCUMENTS

| | | |
|---|---|---|
| JP | 2002-527765 | 8/2002 |
| JP | 2009-135490 | 6/2009 |

*Primary Examiner* — Colin Kreutzer
(74) *Attorney, Agent, or Firm* — Pillsbury Winthrop Shaw Oittman LLP

(57) ABSTRACT

A position measurement system includes a first part and a second part for determining a position of a first member relative to a second member by providing a position signal representing a position of the first part relative to the second part, and a computational unit comprising an input terminal for receiving the position signal. The computational unit is configured to, in use, apply a conversion to the position signal to obtain a signal representing a position of the first member relative to the second member; and apply an adjustment to the conversion to at least partly compensate for a drift of the first part or the second part or both. The adjustment is based on a predetermined drift characteristic of the first part or the second part or both respectively. The predetermined drift characteristic includes one or more base shapes of the first part and/or the second part.

20 Claims, 4 Drawing Sheets

POSITION MEASUREMENT SYSTEM, LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application Ser. No. 61/527,413, entitled "Position Measurement System, Lithographic Apparatus and Device Manufacturing Method", filed on Aug. 25, 2011, and to U.S. Provisional Patent Application Ser. No. 61/592,390, entitled "Position Measurement System, Lithographic Apparatus and Device Manufacturing Method", filed on Jan. 30, 2012. The contents of those applications are incorporated herein in their entirety by reference.

FIELD

The present invention relates to a position measurement system, a lithographic apparatus, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In most cases, the process of exposing the target portions is repeated a plurality of times, thereby generating a device comprising a plurality of layers. In order for proper operation of the device, an accurate positioning of the layers relative to each other is required. As such, during the exposure process, the position of the substrate and relative to the patterning device needs to be known. In order to determine this position, a lithographic apparatus in general comprises a position measurement system such as an interferometer based measurement system or an encoder based measurement system. Such systems can e.g. be used for determining a position of a support e.g. holding a patterning device or substrate relative to a projection system of the apparatus.

In case an encoder based measurement system is used, such system may e.g. comprise one or more one- or two-dimensional gratings and one or more sensors co-operating with the grating or gratings. Such a system can e.g. be used for measuring the position of a substrate table relative to a projection lens by mounting the one or more sensors to the substrate table and mounting the one or more gratings to a reference frame such as a metrology frame to which the projection system is mounted. During use, the sensor or sensors may provide position signals representing the position of the sensor relative to the grating or gratings. When the position of the sensor relative to the substrate and the position of the grating relative to the projection system are known, the position signal can be converted to a position reference (e.g. suitable to be used by a position control system) representing the position of the substrate relative to the projection system. Such a conversion can e.g. comprise one or more look-up tables for converting the position signal from the sensor to a position reference. Such a look-up table or the like can e.g. be determined by an initial calibration of the position measurement system, which may e.g. involve determining overlay or focus maps or may involve the use of a second position measurement system.

As will be understood by the skilled person, an accurate positioning of e.g. the substrate relative to the projection system using the position measurement system as described, relies on the position reference determined from the position signals. However, due to deformations or displacements of either the sensor(s) or grating(s) (or both), the conversion as applied to the position signals may provide an inaccurate position reference which may thus result in an inaccurate positioning of e.g. the substrate during exposure of a target portion on the substrate. In order to at least partly compensate for such a drift, i.e. a deformation or displacement, a periodic calibration of the position measurement system could be considered. However, such a calibration will in general be time-consuming and would thus result in down-time of the apparatus, thus adversely affecting the productivity of the apparatus.

SUMMARY

It is desirable to provide a more accurate position measurement system that applies a calibration that is less time-consuming than conventional calibration methods. Therefore, according to an embodiment of the present invention, there is provided a position measurement system comprising a first part and a second part for determining a position of a first member relative to a second member by providing a position signal representing a position of the first part relative to the second part, and a computational unit comprising an input terminal for receiving the position signal. The computational unit is configured to, in use, apply a conversion to the position signal to obtain a signal representing a position of the first member relative to the second member, and apply an adjustment to the conversion to at least partly compensate for a drift of the first part or the second part or both. The adjustment is based on a predetermined drift characteristic of the first part or the second part or both respectively, whereby the predetermined drift characteristic includes one or more base shapes of the first part or the second part or both.

According to an embodiment of the present invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, and a position measurement system for determining a position of the patterning device or the substrate relative to the projection system. The position measurement system includes a first part mounted to the projection system or a reference frame to which the projection system is mounted, a second part mounted to the support table or substrate table, the first and second part being arranged to provide a position signal representing a position of the first part relative to the second part, and a computational unit comprising an input terminal for receiving the position signal. The computational unit is configured to, in use, apply a conversion to the position signal to obtain a signal representing a position of the projection system relative to the support or substrate table, and apply an adjustment to the conversion to at least partly compensate for a drift of the first part or the second part or both. The adjustment is based on a predetermined drift characteristic of the first part or the second part or both respectively, whereby the predetermined drift characteristic includes one or more base shapes of the first part or the second part or both.

In an embodiment, there is provided a device manufacturing method that includes imparting a radiation beam with a pattern in its cross-section to form a patterned radiation beam; positioning a substrate table holding a substrate; projecting the patterned radiation beam onto a target portion of the substrate; and using a position measurement system for determining a position of the substrate relative to the projection system. The position measurement system includes a first part mounted to the projection system or a reference frame to which the projection system is mounted; a second part mounted to the substrate table, the first and second part being arranged to provide a position signal representing a position of the first part relative to the second part; and a computational unit comprising an input terminal for receiving the position signal. The computational unit is configured to, in use, apply a conversion to the position signal to obtain a signal representing a position of the projection system relative to the substrate table, and apply an adjustment to the conversion to at least partly compensate for a drift of the first part or the second part or both, wherein the adjustment is based on a predetermined drift characteristic of the first part or the second part or both respectively, whereby the predetermined drift characteristic includes one or more base shapes of the first part or the second part or both.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
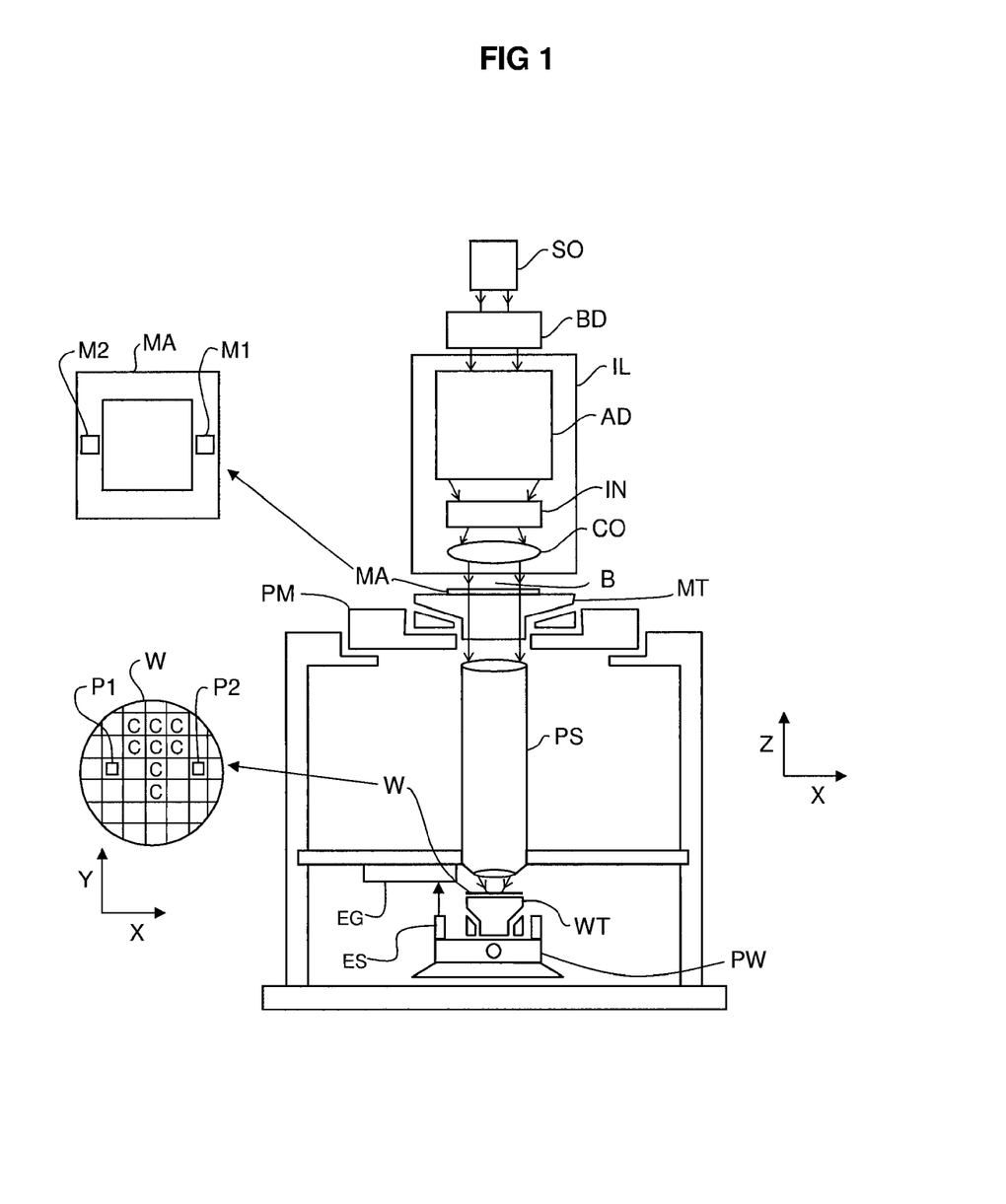
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and a position measurement system, e.g. an encoder based measurement system comprising an encoder grating EG and a sensor ES, the substrate table WT can be moved accurately, e.g. so as to position different target portions C in the path of the radiation beam B. Similarly, the first positioning device PM and another position measurement system (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In general, the position measurement systems as applied to determine the positions of the patterning device and the substrate (e.g. relative to the projection system PL) can comprise a first part (e.g. a grating such as grating EG) that is mounted to a frame, e.g. metrology frame MF to which the projection system PL is mounted and a second part (e.g. one or more sensors such as encoder sensors ES) that can be mounted to the support or substrate table. As will be understood, alternative arrangements whereby one or more gratings are mounted to the support or substrate table and whereby the one or more sensors are mounted to a reference frame such as the metrology frame are feasible as well. In accordance with an embodiment of the present invention, the position measurement system as applied in the lithographic apparatus further comprises a computational unit, which can e.g. take the form of a micro processor or micro controller, dedicated electronics or any other suitable processing device, for processing position signal(s) obtained from the position measurement system. The computational unit is arranged to apply a conversion to the position signal or signals such that a signal is obtained that can e.g. be applied as a position reference representing the position of e.g. the substrate or patterning device relative to the projection system PL. In accordance with an embodiment of the present invention, the computational unit is further arranged to apply an adjustment to the conversion that is based on a predetermined drift characteristic of the measurement system, i.e. either of the first part, the second part or both.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus according to an embodiment of the invention, a position measurement system such as the position measurement system according to an embodiment of the invention is applied.

Figure 2A:
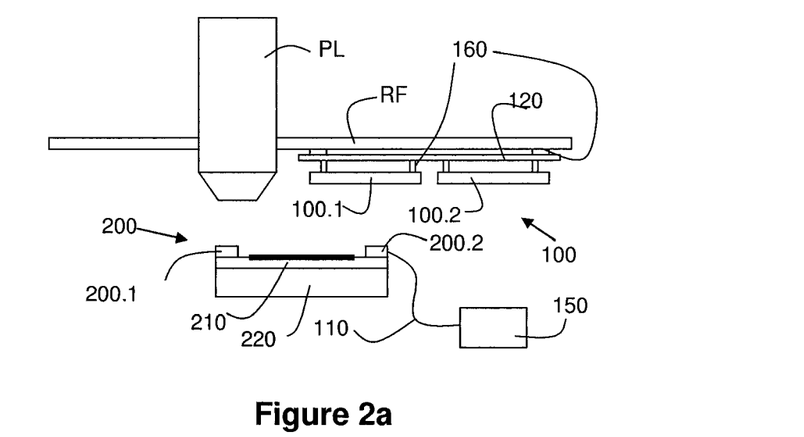
FIG. 2a depicts a position measurement system that can be used in the lithographic apparatus of FIG. 1, according to an embodiment of the invention.

In FIG. 2, a side view of such a position measurement system in accordance with an embodiment is schematically shown. In the arrangement as shown, the position measurement system comprises a first part 100 comprising a first and second grating 100.1, 100.2, which can e.g. be one- or two-dimensional gratings and a second part 200 comprising sensors 200.1 and 200.2 arranged to co-operate with the gratings and to provide a position signal 110 to a computational unit 150 of the measurement system. As an alternative, the first part can comprise one or more one- or two-dimensional position markers arranged to co-operate with a sensor (or sensors) of the second part. Such position markers can e.g. be position reference marks or one or more targets that can be used for capacitance based position sensors, induction based position sensors, short range interferometers, Fizeau interferometers or short range absolute interferometers.

In the arrangement as shown, the gratings 100.1 and 100.2 are mounted to a common frame 120 of the measurement system (the frame e.g. being made from Zerodur or any other type of low thermal expansion material) that is mounted to a reference frame RF to which a projection system PL is also mounted. As shown, the sensors 200.1 and 200.2 are mounted to an object table 210 which can e.g. be a substrate table that is mounted to a stage 220 that is movable relative to the projection system PL, e.g. by means of linear motors or actuators.

During operation, the sensors can provide a signal 110 to the computational unit 150, said signal e.g. representing the position of the sensor 200.1 relative to the grating 100.1. Note that in general, the position signal may represent a position in a horizontal direction (in the XY-plane) or the vertical direction (Z-direction), or a combination thereof.

In order to position the object table, in particular the object mounted to the object table, e.g. a substrate, relative to the projection system PL, the position signal as provided by the sensor is mapped or converted to a signal representing the actual position of the object table 210 relative to the projection system. Such a signal may e.g. further be used as a position reference (or feedback) to a position control system controlling the actuators or motors of the stage 220. Such a mapping or conversion may, e.g. comprise a linear translation. Note that the mapping or conversion may be different for each co-operating pair of a sensor and a grating.

Such a mapping or conversion can e.g. be obtained during an initial setup or calibration of the position measurement system and e.g. stored in the computational unit 150 of the measurement system. Once the position measurement system has thus been calibrated, it has been observed that the system may experience drift. Within the meaning of embodiments of the present invention, drift is used to denote any form of deformation or displacement of the first or second part relative to the structures or members they are mounted to. As such, when referring to FIG. 2, a displacement or deformation of the gratings 100.1 and 100.2 or the common frame 120 relative to the reference frame RF or the projection system PL can be considered as drift. The drift of either the first or second part (or both) of the position measurement system may have different causes. Mechanical or thermal stresses may e.g. cause a drift to occur. An over-constrained mounting of e.g. the gratings to a frame may cause a deformation. Similarly, a deformation of a grating may occur due to gravity. In the arrangement of FIG. 2, a downward displacement of the gratings 100.1, 100.2 or the common frame 120 due to gravity (e.g. due to an elongation of the connections 160 of the gratings or the common frame to the reference frame RF) may occur and affect the calibration.

Due to the drift, the mapping or conversion of the position signals of the sensors to actual positions of the object (or object table) relative to the reference frame RF or projection system is no longer valid or may be inaccurate. As will be understood by the skilled person, such an invalid or inaccurate mapping may adversely affect an exposure process (both in terms of overlay or focus) when the position measurement system is e.g. applied in a lithographic apparatus and thus the yield of the apparatus. The extent to which the conversion is no longer valid or accurate can in such an apparatus e.g. be assessed by determining overlay maps (for assessing in-plane accuracy) or defocus maps (for assessing vertical positioning accuracy). This involves exposing substrates with overlay and focus marks thereby using the position measurement system, such as the system as shown in FIG. 2, to position the substrate table supporting the substrate and assessing the deviations measured. Such deviations can e.g. comprise overlay errors that are due to the inaccurate positioning of the substrate; the inaccurate positioning e.g. being caused by the inaccurate mapping or conversion. By doing so, the nature of the drift can be determined in the desired degrees of freedom and the conversion can be adjusted based on the observed deviations. As these methods require exposure of substrates and assessing the results thereof, such methods may significantly reduce the availability of the apparatus.

As such, alternative methods have been devised to determine an occurring drift of the position measurement system. In this respect, reference can e.g. be made to United States Patent Application Publication No. 2009/0128791, incorporated herein by reference in its entirety. In the referenced application, a drift of the position measurement system is determined based on inconsistencies observed in the position signals obtained from the position measurement system. In the referenced application, such inconsistencies are determined from a redundancy of position signals which may be determined in (part) of the operating area of the position measurement system, as discussed below.

It has been observed by the inventors that the drift as determined from such inconsistencies is only part of the actual drift of the position measurement system. This is due to the fact that certain deformations of the first, second or both parts of the position measurement system do not give rise to any inconsistencies in the position signals obtained. As an example, a vertical displacement of the grating 100.1 or 100.2 in its entirety need not give rise to any inconsistencies in the position signals and may thus not be observed as a drift or drift component. As another example, a tilt of e.g. the common frame 120 together with the gratings will not result in an inconsistency in the position signals either. As will be understood by the skilled person, such a vertical displacement or tilt should however be corrected for, because a vertical displacement of the grating or a tilt from a known or assumed position can, if not compensated, result in a defocus of the substrate or an overlay error during exposure.

In accordance with an embodiment of the present invention, a drift compensation is therefore proposed that is particularly suited for compensating a drift of a position measurement system (or a part thereof) that does not result in inconsistencies in the position signals (note that, as explained below, such drift may however, in an embodiment, be derived on the basis of observed inconsistencies). In accordance with embodiments of the present invention, such a drift compensation of the first part or the second part (or both) of the position measurement system is based on a predetermined drift characteristic of the first part or the second part or both respectively, whereby the predetermined drift characteristic comprising one or more so-called basic or base deformation shapes of the first part or the second part or both. It has been observed by the inventors that a part of the occurring drift can be described as a function of (e.g. a combination of) a limited number of particular deformations, such deformations e.g. including a translation or a tilt or a parabolic deformation. It has been observed by the inventors that such deformations, in embodiments of the present invention referred to as base shapes or base shape deformations (which may thus also include relative displacement of an entire first or second part) may be attributed to specific conditions (mechanical, or operational) and may to a large extend be predicted. Based on the mechanical properties of the system parts (e.g. the gratings), or the manner in which these parts are mounted, a particular deformation shape can be determined (e.g. by simulations) in advance. Similarly, operational conditions such as thermal loads due to heat sources near the position measurement system, or forces acting on (part of) the position measurement system such as acceleration forces of a support having a substrate or patterning device mounted thereon, can also result in a particular deformation shape that can be determined (e.g. by simulations) in advance. Also, when a grating or a sensor array of a position measurement system is e.g. mounted in an over-determined manner, this way of mounting can e.g. result in a particular deformation shape that can be determined (e.g. by simulations) in advance.

When a heat source is e.g. near a grating of a position measurement system, this may result in a particular deformation which can e.g. be described or defined by way of a curve fitting e.g. using polynomials or other functions.

As such, various causes of deformations/displacements (in general, a drift) of a component of the position measurement system can be identified and, for each of these causes, a corresponding deformation or drift of the position measurement system can be determined. Such a drift component or characteristic is referred to in embodiments of the present invention as a base shape or a base shape deformation.

In an embodiment, the base shapes or base shape deformations that are included in the drift characteristic are determined from a mathematical modeling (e.g. using Finite Element Modeling) of the position measurement system. Note that, as an alternative or in addition, the base shapes or base shape deformations may also be determined experimentally.

In accordance with an aspect of the present invention, it has been devised that an actual deformation of a position measurement system (or a component thereof) can manifest itself in various ways and may thus be observed and analyzed in different ways.

Figure 3:
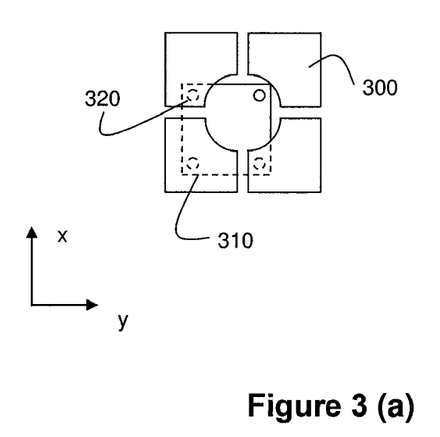
FIGS. 3a and 3b illustrate the use of inconsistencies in an encoder based measurement system.

A first manner in which a deformation or drift of (part of) a position measurement system can be noticed is by means of inconsistencies observed in position measurements. (this is discussed in more detail with reference to FIG. 3 below). In an embodiment of the present invention, such inconsistencies (e.g. presented in an inconsistency map) are analyzed and can be represented as a linear combination of different basic components, which can be referred to as base shapes of base vectors. Phrased differently, given a known configuration of a position measurement system (including mounting aspects and operational aspects), a possible deformation of the measurement system can be described as a linear combination of a limited set of basic deformations. Such deformations can be described mathematically as base shapes or base vectors. Given a combination of one or more of such base shapes or base vectors (e.g. a linear weighted combination), a deformation can be described. Further, given such a deformation, it can be determined which inconsistencies (in position measurements) would be observed, when such a deformation would actually occurs. As such, in an embodiment of the present invention, the one or more base shapes include a first set of one or more base vectors for representing an inconsistency map. In such a set of base vectors, each vector would thus represent a particular inconsistency.

A second manner in which a deformation or drift of (part of) a position measurement system can be observed is by means of overlay or focus measurements, resulting in overlay or focus maps describing an overlay or (de)focus of the exposure process as a function position on a wafer or substrate. As mentioned above, this involves exposing substrates with overlay and focus marks thereby using the position measurement system. When such overlay or focus maps are available, a set of base shapes or base vectors can be sought (describing possible deformations of the position measurement system) which, when combined in a particular manner, would give rise to (or be an approximation of) a given overlap or focus map. Therefore, in an embodiment of the present invention, the one or more base shapes include a second set of one or more base vectors for representing an overlay or focus map. Each base vector in this second set of base vectors may thus describe a particular overlay or focus distribution of a substrate, whereby a combination of such vectors (e.g. a linear weighted combination) would thus result in an overlay or (de)focus map that can be used to approximate an actual overlay or (de)focus map.

In an embodiment, a mapping is derived between the first set of base vectors (suitable to represent an inconsistency) and the second set of base vectors (suitable to represent an overlay or (de)focus map). Such mapping provides a correlation between the first set of base vectors and the second set of base vectors such that, for a given combination of vectors of the first set of base vectors, a corresponding combination of vectors of the second set of base vectors can be derived.

In an embodiment, the base shapes comprise a first set of base vectors for describing an inconsistency and a second set of base vectors for describing an overlay and/or defocus map and wherein the correlation is obtained by determining a combination of the first set of base vectors to represent the inconsistency, mapping the combination of the first set of base vectors to a combination of the second set of base vectors; the combination of the second set of base vectors representing the overlay and/or defocus map.

In an embodiment, such a mapping can be used to approximate an overlay or (de)focus map from an observed inconsistency map. In such embodiment, the following process may thus be performed:

In a first step, an inconsistency map is derived from position measurements in an area where a redundant set of measurements is available.

In a second step, the first set of base vectors is used to approximate the inconsistency map by a combination (e.g. a linear weighted combination) of the base vectors.

In a third step, the aforementioned mapping is used to determine a corresponding combination of vectors of the second set of base vectors, this combination thus describing an overlay and/or (de)focus map.

In a fourth step, such an overlay or (de)focus map can be used to determine the adjustment as applied to the conversion of the position signals, in order to improve the overlay or focusing.

In accordance with an embodiment of the present invention, base shapes (e.g. the base vectors representing an inconsistency map or an overlay or (de)focus map) may thus, as mentioned, be determined in advance and information describing these shapes may thus be stored, in a suitable format, in the computational unit of the position measurement system according to an embodiment of the invention, e.g. in a database.

As mentioned above, the base shapes that are applied to determine, in accordance with embodiments of the invention, an adjustment to the conversion of the position signals, may be attributed to several causes such as the manner of mounting but also to deformations due to gravity or thermal loading caused by heat sources near the position measurement system. As mentioned, in some cases, the drift corresponding to these basic deformation shapes will not be detectable as inconsistencies in the position measurements (such a drift or deformation is further on referred to as consistent drift or deformation). Even though certain deformations may thus not be visible in an inconsistency map, they may however give rise to errors with respect to overlay or focus. As such, when the aforementioned mapping between the first set of base vectors and the second set of base vectors is used, at least part of the consistent drift a position measurement system can be compensated for, based on inconsistency measurements. As such, in an embodiment, the adjustment as applied to the conversion and which is based on a predetermined drift characteristic that includes one or more base shapes of the first part or the second part or both (e.g. the first and second set of base vectors as mentioned above) can be used to at least partly compensate for the consistent drift of the position measurement system.

In an embodiment, a correlation is thus derived between inconsistencies observed in the position measurements and both the inconsistent and consistent drift or deformation. Such a correlation can e.g. be derived from a Finite Element model of the position measurement system, thereby deriving, for a given deformation of the position measurement system both the occurring inconsistencies and overlay/focus maps and the mentioned set of first and second base vectors.

Figure 2B:
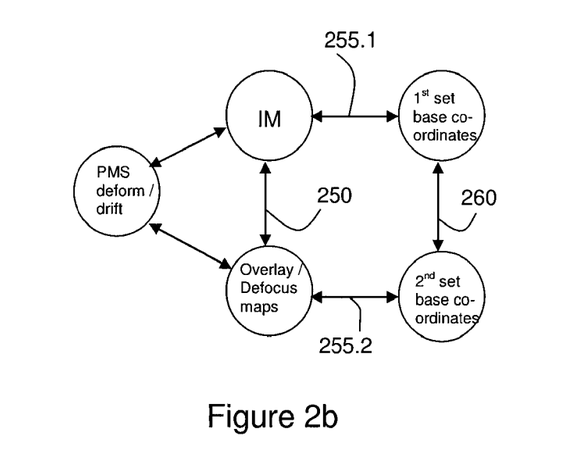
FIG. 2b depicts the relationship between a deformation or drift of a position measurement system, inconsistencies and overlay and/or defocus effects

FIG. 2b schematically indicates the relationship between an actual deformation or drift, the inconsistencies and errors (such as overlay or defocus) that are observable and the corresponding weights of the base shapes.

In FIG. 2b, PM deform/drift indicates an actual deformation or drift of a position measurement system (PMS). Such a drift or deformation may give rise to inconsistencies in the position measurements (which can be represented in an inconsistency map (IM)) and overlay and/or focus errors (overlay/focus maps). Both the inconsistencies and the overlay/focus errors are detectable quantities which can be measured. It should however be mentioned that determining an inconsistency map may require less effort and time than determining an overlay or defocus map. Whereas an inconsistency map may be determined and updated in real time, determining an overlay or defocus map may require the exposure of a dedicated substrate with overlay or focus marks. As such, determining an overlay or defocus map may result in an important down-time of the apparatus and may thus adversely affect the productivity of the apparatus. In accordance with an embodiment of the present invention a correlation 250 between the inconsistency map IM and the overlay and/or defocus map is determined using a predetermined drift characteristic including one or more base shapes. In such embodiment, both the inconsistency map (IM) and the overlay and/or defocus map may, as shown in FIG. 2b, can be mapped (indicated by the arrows 255.1 and 255.2) to a resp. set of first and second base vectors or base shapes and thus be represented by a first resp. second set of base co-ordinates or weights ($1^{st}$ set, $2^{nd}$ set). Such a set of weights thus describing a particular combination of base vectors or base shapes that represents/approximates either an inconsistency map IM or an overlay or (de)focus map. By mapping 260 both sets of base co-ordinates onto one another, the correlation 250 is determined between the inconsistencies (IM), which are determined comparatively easy, and the corresponding overlay or defocus errors, which would require an important measurement effort.

Using the approach as depicted, an adjustment to the conversion of the position signals may thus be based on the inconsistencies observed, even though a consistent drift cannot actually be measured using inconsistency measurement. In such an arrangement, as will be explained below with reference to FIG. 3, the inconsistencies can be described in an inconsistency map or maps in part of the operating area where a redundant set of position measurements are available. Again, as there are only a limited (finite) set of causes that can result in a drift, an inconsistency map can be described/approximated as combination of inconsistency base vectors (i.e. the first set of base vectors), each e.g. describing an inconsistency map obtained due to a particular cause, e.g. a particular way of mounting or a particular load of the position measurement system.

As such, in accordance with an embodiment of the present invention, the computational unit is further arranged to determine an inconsistency map and determine a further adjustment of the conversion based on the inconsistency map.

In an embodiment, the conversion as applied to the position signal comprises a mapping e.g. formulated as a look-up table. In such an arrangement, the adjustment can be formulated as a modification of the look-up table.

As an alternative, the conversion can be formulated using functions such as polynomials, the adjustment then being formulated as an adjustment to the parameters of the polynomials.

In FIG. 3, a top view is shown of a position measurement system comprising 4 plate-shaped gratings 300 arranged above a stage (such as a substrate stage) 310 provided with 4 sensors 320 arranged near the corners of the stage, whereby each sensor provides a vertical (z-position) and a horizontal (x-position or y-position) position signal. As such, when the stage is in such a position that only 3 sensors are operational (i.e. are in a position below a grating), as depicted in FIG. 3(a), 6 position signals are obtained which are sufficient to determine the stage position in 6 degrees of freedom. When the stage is in a position as depicted in FIG. 3(b), 8 position signals are available which can, due to drift of the gratings or of a common frame connecting the gratings to a reference frame, be inconsistent. Such an inconsistency can be formulated in different ways: there is a difference between 2 position signals and a prediction of those 2 signals based on the other 6 signals; there is a difference between a stage position derived from one subset of 6 signals and a position based on another subset of 6 signals.

As will be understood, the inconsistencies can be attributed to an infinite number of different deformations/drifts of the gratings and/or the sensors. As such, there are an infinite number of ways to convert the inconsistent set of signals to a consistent set of signals.

In accordance with an embodiment of the present invention, the inconsistency is not removed in an arbitrary manner, rather, the inconsistency is attributed to a distinct, limited number of deformations that are e.g. determined by means of Finite Element calculations. Using such calculations, as explained above, base shape deformations due to specific causes can be determined. When such a deformation is determined, it is also feasible to determine a corresponding inconsistency map in case the deformation gives rise to an inconsistency in the position signals. As such, from a set of base shape deformations, a set of inconsistency base vectors can be derived. The term base vector is hereby used to denote a mathematical description of a particular inconsistency derived form a particular base shape. These inconsistency base vectors can e.g. be used in an embodiment of the present invention to represent a measured inconsistency map (e.g. as a linear, weighted combination of the inconsistency base vectors). Such a representation may subsequently be transformed or converted to a combination of the base shape deformations from which combination an adjustment of the conversion of the position signals can be derived.

Figure 4:
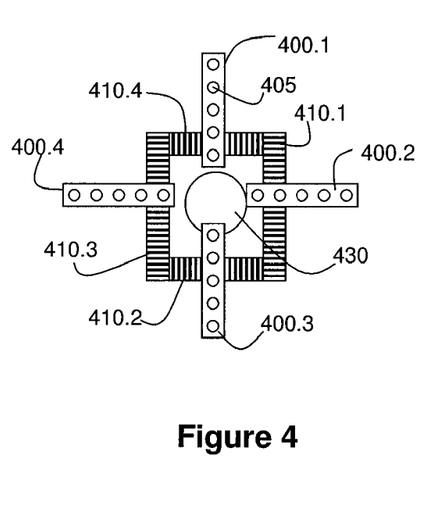
FIG. 4 depicts another position measurement system according to an embodiment of the invention.

In FIG. 4, a top view of an embodiment of a position measurement system (an encoder based measurement system as the system as described in FIG. 2) according to an embodiment of the present invention is schematically shown. The position measurement system comprises 4 sensor arrays 400.1, 400.2, 400.3 and 400.4 (each comprising a plurality of sensors 405) that can e.g. be mounted to a reference frame (not shown) and 4 gratings 410.1-410.4 that are mounted to a substrate stage arranged to hold a substrate 430. By using 4 sensor arrays in the arrangement as shown, the stage can cover a comparatively large operating area under control of the sensors while maintaining the gratings (that are mounted to the stage) comparatively small. When any of the sensors of the arrays is above any of the gratings, a position signal can be obtained and processed in a similar manner as described above. Again, as described above, the position signal or signals can be converted to obtain a position of the substrate relative to the projection system, e.g. by a coordinate mapping of the position signals using a look-up table. In accordance with embodiments of the present invention, an adjustment is applied to this conversion in order to take account of a drift of e.g. one or more of the sensor arrays or the gratings. Such an adjustment can e.g. be based on a predetermined drift characteristic of a sensor array or of the assembly of sensor arrays as a whole, whereby the drift characteristic includes base shapes of the array or assembly of arrays.

Further, it can be understood that, the position measurement system as shown also enables the generation of a redundant set of position signals in (part of) the operating area of the stage from which inconsistencies or an inconsistency map can be derived. Such inconsistencies may equally be used to apply a further adjustment to the conversion of the position signals, in a similar manner as described above.

In the embodiments as discussed above, the effect of a deformation or drift of (part of) a position measurement system (e.g. an encoder or interferometer based measurement system) is estimated (using a predetermined drift characteristic that includes one or more base shapes) is determined and used to adjust a conversion of a position measurement signal.

In the embodiments as discussed, the adjustment can e.g. be based on a measured inconsistency in position measurement signals, which can e.g. be available in part of the operating range of the object that is positioned. In order to observe such an inconsistency, a redundant set of position measurements should be available. Such a redundant set of position measurement will in general only be available for part of the operating range of the object that is positioned. (note however that the present invention does not exclude embodiments whereby redundant position measurements are available over the entire operating area of the position measurement system; such measurement systems e.g. including more than the 4 sensors (co-operating with a grating) as illustrated in FIGS. 3a and 3b) As such, the modeling of the deformation (e.g. using the above mentioned first set of base vectors) resulting from the inconsistency may be subject to the following approximations or error sources:

1. In case the inconsistency is only available for part of the measurement range (or operating range), an extrapolation can be involved in determining the deformation or drift in areas where no inconsistency can be measured.

2. An error in the position measurement may affect the actual value of the inconsistency that is determined and thus of the subsequent modeling of the deformation or drift.

3. As the area of the operating or measurement range where redundant measurements are available is in general predetermined and depends on the layout of the apparatus, and may be to some extend be insensitive to the deformation or drift, or, for the given area where such redundant measurements are available, it may be difficult to distinguish the different occurring basic deformations or base shapes. Phrased differently, the modeling of the inconsistencies (e.g. using the inconsistency map) into a combination of one or more base vectors might be a so-called ill-conditioned problem; or the model used may have a comparatively high conditioning number. (note that this may also be true when a redundant set of position measurements is available in the entire operating range) Similarly, the mapping as referred above to map a modeled inconsistency (using the first set of base vectors) to a model representing an overlay and/or defocus map (using the second set of base vectors) may suffer from the same ill-conditioning.

Due to this ill-conditioning, the modeled deformation or drift may have some inaccuracies which could affect the adjustment made to the conversion of the position signals. In order to avoid, or at least mitigate, this issue, an aspect of the present invention is to make use of sensors to more accurately determine or predict an actual deformation or drift of (part of) a position measurement system.

In such embodiments, a plurality of temperature and/or strain sensors is used, together with a predetermined drift characteristic including one or more base shapes, to determine an adjustment to a conversion of a position signal. Note that this approach provides a third way in which a deformation or drift can be observed; as mentioned, a first way to observe a deformation or drift is by means of inconsistencies in position measurements (e.g. in part of the operating area where redundant position measurements are available) and a second way is by means of performing overlay or focus measurements and establishing an overlay or defocus map (whereby at least part of the overlay or focus error can be attributed to a deformation or drift of the measurement system. In accordance with an embodiment of the present invention, temperature or strain sensors can be used in the following manner to facilitate in the prediction of a deformation or drift of a position measurement system:

As will be understood by the skilled person, a deformation of (part of) a position measurement system (e.g. a one or two dimensional grating or a sensor array) will give rise to local deformations which could be observed by strain sensors. Further, as an important cause of deformation or drift, a thermal load can be mentioned. As such, strain or temperature sensors can provide an indication of a deformation or drift of a position measurement system. Using simulations, such as Finite Element simulations, a particular load situation (e.g. including forces and thermal loads generated by actuators) can be modeled thereby obtaining feedback on the deformation or temperature distribution for the given load situation. Note that, as an alternative or in addition, measurements may be applied as well to analyze different load situations.

Note that such simulations may also, as indicated above, facilitate in establishing a set of base shapes or base vectors describing particular deformations, which can e.g. be attributed to particular causes such as thermal loads.

In an embodiment, such simulations are in addition used to determine an optimal or desired position for mounting the plurality of sensors (temperature or strain sensors, or a mixture thereof). In order to determine an optimal or desired position for the sensors, one or more of the following criteria can be used:

the position of a strain or temperature sensor can be based on an absolute or peak value of the strain or temperature as simulated. Alternatively:

the position of the sensor can be such as to facilitate distinguishing different deformation shapes (i.e. base shapes).

Ideally, the latter option could result in a set of positions for sensors and a corresponding set of base shapes which are orthogonal. In practice, such a situation is unlikely to occur, however, by an appropriate selection of the position of the sensors, the problem of modeling the deformation (by a number of base shapes) or the aforementioned mapping can have an improved condition number. As such, the application of the plurality of sensors (strain and/or temperature sensors) in embodiments of the present invention can be twofold:

In an embodiment, the feedback as obtained from the sensors can be used directly to model a deformation or drift of the position measurement system.

Alternatively, in an embodiment, the feedback as obtained from one or more sensors can be used as an additional input or constraint for obtaining an improved modeling of the deformation or drift using inconsistency maps, or vice versa; an inconsistency map be used as additional input or as a constraint for obtaining a modeling of the deformation or drift based on the sensor feedback. Both ways of employing a sensor feedback are explained in more detail below:

In an embodiment of the position measurement system according to the invention, the position measurement system (e.g. an encoder based measurement system) is provided with a plurality of temperature and/or strain sensors, wherein the input terminal of the computational unit is configured to receive a sensor signal of the plurality of sensors and wherein the computational unit is further arranged to, in use, determine the adjustment to the conversion based on the sensor signal. In such embodiment, the plurality of sensors can e.g. be mounted at predetermined locations on a grating or a sensor array of the position measurement system.

In order to determine at which location the sensors should be positioned, the following approach can be applied:

In a first step, a thermo-dynamic analysis of the position measurement system is performed. Such an analysis can e.g. involve determining the thermo-dynamic behavior of the system as a function of time whereby representative loads (e.g. thermal loads) are applied. Note that such an analysis can be performed using an experimental set-up of the system or can be based on simulations. From the observed behavior, a set of base shapes, describing the most relevant deformation modes can be derived. This can e.g. be done using mathematical techniques known as singular value analysis or decomposition, principal component analysis or POD (proper orthogonal decomposition). Such a set of base shapes should thus enables to describe an occurring load situation as a combination (e.g. a linear weighted combination) of the base shapes. Using the described techniques, an assessment can be made how many base shapes are required to describe, within a desired accuracy. Ideally, this number of base shapes thus also indicates the minimum number of sensors required to estimate or approximate an actual load situation using a feedback of the sensors. Based on the analysis mentioned, the most important dynamic components affecting the deformation or drift can be identified; therefore, at least the same number of sensors as the number of dynamic components should be employed.

In a second step, an optimal position for the set of sensors is determined. In accordance with an embodiment of the present invention, an optimal position for the sensors corresponds to positions whereby the different base shapes are most easily distinguishable. Mathematically this can be expressed as a matrix, further on referred to as the sensor-base-shape matrix, that describes the relationship between the sensor signals and a deformation or drift of the position measurement system, having a low condition number. Using the Finite Element calculations and/or experimental measurements, such a sensor-base-shape matrix can be constructed and used as a model to determine an actual deformation of a position measurement system in a particular on-line load situation. Such a matrix is in general a static matrix having a number of columns equal to the number of sensors and the number of rows equal to the number of base shapes.

Using this approach, the sensitivity of the model (i.e. the applied matrix) for effects such as measurement errors or noise can be determined and is available via the condition number of the matrix. When the sensitivity is found to be too high, additional sensors can be included in the model until an acceptable sensitivity is obtained.

In an embodiment, the position and number of the plurality of sensors is determined to maintain a condition number of the sensor-base-shape matrix below a predetermined threshold.

In an embodiment, a mixture of both temperature sensors and strain sensors is applied for providing a sensor signal to the computational unit. In such an arrangement, an optimal choice of the type of sensor (strain or temperature) can be made that improves the distinguishability of the various base shapes and thus further reduces the conditioning number.

As already mentioned, in an embodiment, the application of the sensor-base-shape matrix can be combined with inconsistency measurements as described above. As an example, when a deformation or drift of a position measurement system or part thereof is determined using the sensor-base-shape matrix, one can determine the inconsistencies in the position measurement which should be measured in case of such a deformation or drift. These inconsistencies can be compared with an actual inconsistency map derived from a redundant set of position measurements as explained above. Any mismatch between both inconsistencies might give rise to e.g. making adjustments to the model used, e.g. the sensor-base-shape matrix.

Alternatively, in case an inconsistency map is used to determine/predict a deformation or drift, any further information, e.g. obtained via sensor signals, can be used to refine or correct the modeling or can be used as a verification. To illustrate this: in case, using an inconsistency map and a mapping between a first set of base vectors to a second set of base vectors is used to determine a deformation of part of the position measurement system, one can, to a certain degree, check if this deformation is actually occurring based on feedback from strain sensors.

In the embodiments of the position measurement system as described, it may also be beneficial to include other types of sensors which may provide additional input to check or correct a modeled deformation or drift. As an example, position sensors such as capacitive sensors could be used to determine an actual position of e.g. a corner of a grating or sensor array, thereby providing feedback to verify a modeled or mathematically determined deformation or drift.

In an embodiment, the adjustment of the conversion is periodically applied, e.g. once every week. By doing so, the conversion (i.e. the adjusted conversion) as applied to position signals may enable an accurate positioning for a comparatively long period of time thereby avoiding the application of time-consuming recalibrations that e.g. require the assessment of overlay maps and focus maps.

Although the way of compensating for, at least part of, the drift of a position measurement system as proposed is particularly suited for encoder based measurement systems, the application in other types of position measurement systems such as interferometer based measurement systems may equally be considered.

In an embodiment of the lithographic apparatus, the one or more arrays or sensors and the one or more one- or two-dimensional gratings are arranged to provide an over-determined number of position signals in an operating area of the support or substrate table, and wherein the over-determined number of signals is used to determine an inconsistency map.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A position measurement system comprising:
   a first part and a second part configured to determine a position of a first member relative to a second member by providing a position signal representing a position of the first part relative to the second part; and
   a computational unit comprising an input terminal configured to receive the position signal, the computational unit being configured to, in use, apply a conversion to the position signal to obtain a signal representing a position of the first member relative to the second member, and to apply an adjustment to the conversion to at least partly compensate for a drift of the first part or the second part or both, wherein the adjustment is based on a predetermined drift characteristic of the first part or the second part or both, respectively, and wherein the predetermined drift characteristic includes one or more base shapes of the first part or the second part or both.

2. The position measurement system according to claim 1, wherein the first part comprises a grating, and wherein the second part comprises a sensor or sensor array configured to co-operate with the grating and to provide the position signal.

3. The position measurement system according to claim 1, wherein the adjustment is periodically applied.

4. The position measurement system according to claim 1, wherein the position measurement system is configured to determine an inconsistency between a plurality of position signals representing a position of the first part relative to the second part, and wherein the computational unit is further configured to determine the adjustment based on the inconsistency.

5. The position measurement system according to claim 4, wherein the inconsistency comprises an inconsistency map describing the inconsistency as a function of the position of the first member relative to the second member, and wherein the adjustment is derived from the inconsistency map and the predetermined drift characteristic.

6. The position measurement system according to claim 4, wherein the predetermined drift characteristic comprises a correlation between the inconsistency and an overlay and/or defocus map.

7. The position measurement system according to claim 4, wherein the first part comprises a one or two-dimensional grating, and wherein the second part comprises a plurality of sensors providing an over-determined number of position signals when co-operating with the one- or two-dimensional grating, the inconsistency being based on the over-determined number of position signals.

8. The position measurement system according to claim 1, wherein the base shapes are determined by means of Finite Element Simulations or position measurements.

9. The position measurement system according to claim 1, wherein the system is further provided with a plurality of temperature and/or strain sensors, wherein the input terminal of the computational unit is configured to receive a sensor signal of the plurality of sensors and wherein the computational unit is further arranged to, in use, determine the adjustment to the conversion based on the sensor signal.

10. The position measurement system according to claim 9 wherein the base shapes are determined using Finite Element modeling of a plurality of load situations.

11. The position measurement system according to claim 9, wherein a position of the plurality of sensors is based on a distinguishability of the base shapes by the plurality of sensors.

12. The position measurement system according to claim 9, wherein the predetermined drift characteristic comprises a sensor-base-shape matrix for converting the sensor signal to a deformation or drift of the position measurement system.

13. A lithographic apparatus comprising:
a projection system configured to project a patterned radiation beam onto a target portion of a substrate; and
a position measurement system according to claim 1, the position measurement system being configured to position the substrate relative to the projection system.

14. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
a position measurement system configured to determine a position of the patterning device or the substrate relative to the projection system, the position measurement system comprising
a first part mounted to the projection system or a reference frame to which the projection system is mounted;
a second part mounted to the support table or substrate table, the first and second part being arranged to provide a position signal representing a position of the first part relative to the second part; and
a computational unit comprising an input terminal configured to receive the position signal, the computational unit being configured to, in use,
apply a conversion to the position signal to obtain a signal representing a position of the projection system relative to the support or the substrate table, and
apply an adjustment to the conversion to at least partly compensate for a drift of the first part or the second part or both, wherein the adjustment is based on a predetermined drift characteristic of the first part or the second part or both, respectively, and wherein the predetermined drift characteristic includes one or more base shapes of the first part or the second part or both.

15. The lithographic apparatus according to claim 14, wherein the first part comprises one or more arrays of sensors, and wherein the second part comprises one or more one- or two-dimensional gratings.

16. The lithographic apparatus according to claim 14, wherein the first part comprises one or more arrays of sensors, and wherein the second part comprises one or more one- or two-dimensional position markers.

17. The lithographic apparatus according to claim 14, wherein the first part comprises one or more arrays of sensors, and wherein the second part comprises one or more targets used for capacitance based position sensors, induction based position sensors, short range interferometers, Fizeau interferometers or short range absolute interferometers.

18. The lithographic apparatus according to claim 14, wherein the predetermined drift characteristic includes one or more base shapes of one or more arrays of sensors.

19. A device manufacturing method comprising
transferring a pattern from a patterning device onto a substrate, wherein, during said transferring, a position of said patterning device or said substrate is measured using a position measurement system according to claim 1.

20. A device manufacturing method comprising:
imparting a radiation beam with a pattern in its cross-section to form a patterned radiation beam;
positioning a substrate table holding a substrate;
projecting the patterned radiation beam onto a target portion of the substrate, thereby using a position measurement system configured to determine a position of the substrate relative to the projection system, the position measurement system comprising
a first part mounted to the projection system or a reference frame to which the projection system is mounted,
a second part mounted to the substrate table, the first and second part being arranged to provide a position signal representing a position of the first part relative to the second part, and
a computational unit comprising an input terminal configured to receive the position signal, the computational unit being configured to, in use,
apply a conversion to the position signal to obtain a signal representing a position of the projection system relative to the substrate table, and
apply an adjustment to the conversion to at least partly compensate for a drift of the first part or the second part or both, wherein the adjustment is based on a predetermined drift characteristic of the first part or the second part or both, respectively, and wherein the predetermined drift characteristic includes one or more base shapes of the first part or the second part or both.

* * * * *